US008671766B2

(12) United States Patent
Sterling et al.

(10) Patent No.: US 8,671,766 B2
(45) Date of Patent: Mar. 18, 2014

(54) INTEGRATED PRESSURE SENSOR SEAL

(75) Inventors: James William Sterling, Novi, MI (US); Steven Gross, Northville, MI (US)

(73) Assignee: Infineon Technologies AG, Neubiberg (DE)

( * ) Notice: Subject to any disclaimer, the term of this patent is extended or adjusted under 35 U.S.C. 154(b) by 354 days.

(21) Appl. No.: 13/111,362

(22) Filed: May 19, 2011

(65) Prior Publication Data
US 2012/0291559 A1 Nov. 22, 2012

(51) Int. Cl.
*G01L 9/00* (2006.01)

(52) U.S. Cl.
USPC ............... 73/723; 73/700; 73/706; 73/753

(58) Field of Classification Search
None
See application file for complete search history.

(56) References Cited

U.S. PATENT DOCUMENTS

| | | | |
|---|---|---|---|
| 4,276,533 A * | 6/1981 | Tominaga et al. | 338/4 |
| 4,461,180 A * | 7/1984 | Hellouin de Menibus | 73/706 |
| 4,901,197 A * | 2/1990 | Albarda et al. | 361/283.1 |
| 4,970,898 A * | 11/1990 | Walish et al. | 73/706 |
| 5,285,690 A * | 2/1994 | Koen et al. | 73/727 |
| 5,412,992 A * | 5/1995 | Tobita et al. | 73/721 |
| 5,438,876 A * | 8/1995 | Lewis | 73/726 |
| 5,684,253 A * | 11/1997 | Bonne et al. | 73/706 |
| 6,255,728 B1 * | 7/2001 | Nasiri et al. | 257/704 |
| 6,351,996 B1 * | 3/2002 | Nasiri et al. | 73/706 |
| 6,561,038 B2 * | 5/2003 | Gravel et al. | 73/729.2 |
| 6,807,864 B2 * | 10/2004 | Takakuwa et al. | 73/706 |
| 6,920,795 B2 * | 7/2005 | Bischoff et al. | 73/706 |
| 7,216,545 B2 * | 5/2007 | Uchida et al. | 73/705 |
| 7,252,011 B2 * | 8/2007 | Traverso | 73/756 |
| 7,389,695 B2 * | 6/2008 | Skwara | 73/708 |
| 7,454,976 B2 * | 11/2008 | Wanami et al. | 73/730 |
| 7,814,797 B2 * | 10/2010 | Shikata et al. | 73/714 |

OTHER PUBLICATIONS

Caron, E.; "Tire Pressure Monitoring System in a Single Package with Tire Localization Capability using Capacitive Sensor Technology"; FreeScale Semiconductor; Jun. 11 2007, p. 1-21.

* cited by examiner

*Primary Examiner* — Lisa Caputo
*Assistant Examiner* — Jermaine Jenkins
(74) *Attorney, Agent, or Firm* — Eschweiler & Associates, LLC

(57) ABSTRACT

Some embodiments of the present disclosure relate to improved package assemblies for pressure sensing elements. Rather than leaving a pressure sensing element unabashedly exposed to the ambient environment in a manner that makes it susceptible to damage from stray wires, dirt, and the like; the improved package assemblies disclosed herein include a cover that helps form an enclosure around the pressure sensing element. The cover includes a fluid-flow channel with a blocking member arranged therein. The fluid-flow channel puts the pressure sensing element in fluid communication with the external environment so pressure measurements can be taken, while the blocking member helps protect the pressure sensing element from the external environment (e.g., stray wires and dirt to some extent). In this way, the package assemblies disclosed herein help promote more accurate and reliable pressure measurements than previous implementations.

21 Claims, 4 Drawing Sheets

INTEGRATED PRESSURE SENSOR SEAL

BACKGROUND

Pressure sensors are used in many contexts, such as automotive, industrial, medical, aviation, and consumer electronics, for example. In the automotive context for example, pressure sensors are used to measure intake manifold air pressure and vacuum, and can also be used in air bag deployment and other applications.

Conventional pressure sensors are packaged in integrated circuit (IC) packages. However, some conventional IC packages leave their pressure sensors unabashedly exposed to the ambient environment (e.g., unabashedly exposed to the air) so the sensor can measure the ambient pressure. Unfortunately, however, leaving the pressure sensor unabashedly exposed to the ambient environment can lead to problems. For example, stray wires or dirt from the ambient environment can come into physical contact with the exposed pressure sensor and thereby cause inaccurate pressure measurements or even damage the pressure sensor itself. Therefore, although conventional pressure sensors and their associated integrated circuit packages are sufficient in some regards, the inventors have devised improved pressure sensors and associated packages as set forth herein.

DETAILED DESCRIPTION

Figure 1:
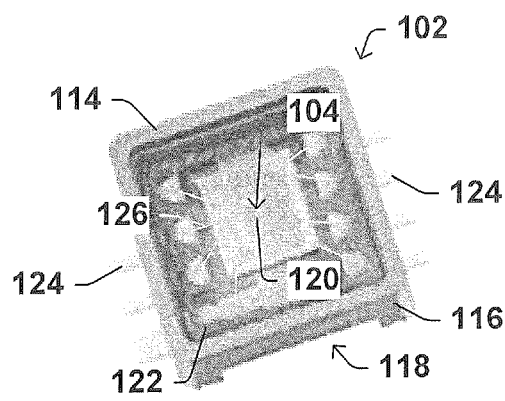
FIG. 1 is an isometric view of a package substrate with a pressure sensing element mounted thereon.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details.

Some embodiments of the present disclosure relate to improved package assemblies for pressure sensing elements. Rather than leaving a pressure sensing element unabashedly exposed to the ambient environment in a manner that makes it susceptible to damage from stray wires, dirt, and the like; the improved package assemblies disclosed herein include a cover that helps form an enclosure around the pressure sensing element. The cover includes a fluid-flow channel with a blocking member arranged therein. The fluid-flow channel puts the pressure sensing element in fluid communication with the external environment so pressure measurements can be taken, while the blocking member helps protect the pressure sensing element from the external environment (e.g., stray wires and dirt to some extent). In this way, the package assemblies disclosed herein help promote more accurate and reliable pressure measurements than previous implementations.

It will be appreciated that the term "fluid" as used herein refers to any substance that has no fixed shape and yields easily to external pressure. For example, a typical fluid can include a gas (e.g., air) and/or a liquid (e.g., water). Consequently, a fluid-flow channel as disclosed herein is merely structured to allow fluid (e.g., air and/or water) to travel there through, often but not necessarily in both directions.

Figure 2:
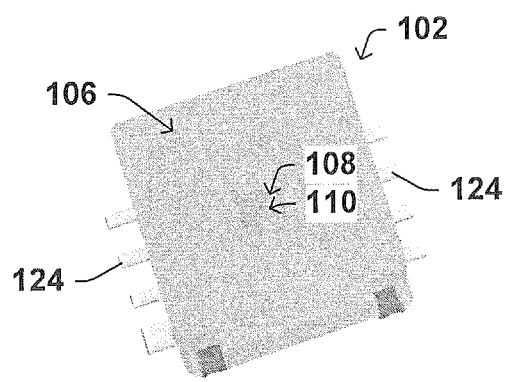
FIG. 2 is an isometric view of a package substrate with a cover placed thereover.
Figure 3:
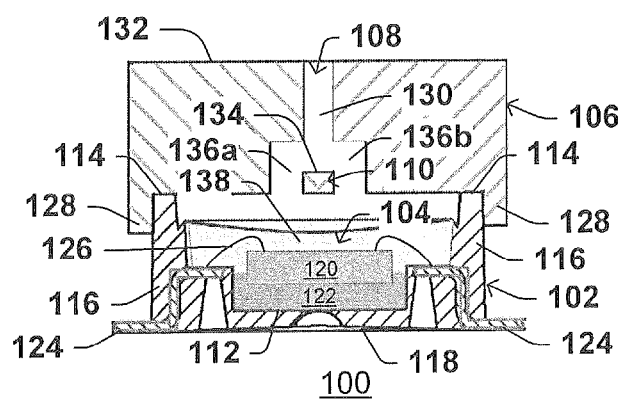
FIG. 3 is a cross-sectional view of a package substrate with a cover placed there over.

One embodiment of an apparatus 100 in accordance with some embodiments is now described with reference to FIGS. 1-3 collectively. As will be appreciated in more detail below, FIG. 1 shows a package substrate 102 with a pressure sensing element 104 mounted thereon. FIG. 2 shows the package substrate 102 with a cover 106 placed there over to form a package enclosure around the pressure sensing element 104, and FIG. 3 shows a cross-sectional view of the package substrate 102 and cover 106 there over. Notably, the cover 106 includes a fluid-flow channel 108 that includes a blocking member 110 therein. This fluid-flow channel 108 puts the pressure sensing element 104 in fluid communication with the external environment, while the blocking member 110 helps protect the pressure sensing element 104 from the external environment (e.g., stray wires and dirt to some extent). Consequently, this configuration allows the pressure sensing element 104 to measure the ambient pressure in a reliable and accurate way. These components are now described in more detail below.

The package substrate 102, which can be a ceramic or plastic substrate for example, includes a mounting surface 112 configured to engage the pressure sensing element 104. Typically, the mounting surface 112 is at least approximately planar and has a surface area that corresponds to (or is greater than) an area of the pressure sensing element 104. The package substrate 102 also includes an engagement surface 114 configured to engage the cover 106. The engagement surface 114 is often positioned atop a sidewall 116 extending upwards from a package substrate base 118.

The pressure sensing element 104 is mounted to the mounting surface 112. In the illustrated embodiment, the pressure sensing element 104 includes an integrated circuit 120 (e.g., a micro electrical-mechanical system (MEMs) including a pressure-sensitive diaphragm) and a lead frame or other chip carrier 122. Typically, the lead frame or other chip carrier 122 is adhered to the mounting surface 112, for example by using epoxy, solder, fasteners, or some other bonding element. The integrated circuit 120 can then be physically adhered to the lead frame or chip carrier 122 by using epoxy, solder, fasteners, or some other bonding element, and can be electrically coupled to the lead frame or chip carrier 122 by using wire bonding, soldering, or some other electrical connection.

At least one electrical contact is accessible on an exterior surface of the package enclosure and is configured to provide electrical communication between the pressure sensing element 104 and an external circuit (not shown). In the illustrated embodiment, the at least one electrical contact takes the form of eight conductive pins 124, each of which extends through the package substrate sidewall 116 and/or base 118. A wire bond 126 physically and electrically couples each pin 124 to a corresponding bond pad on the integrated circuit 120. In this way, voltages and currents can be communicated to and from the integrated circuit 120 (e.g., to and from a MEMS pressure sensor on the IC) with respect to the external environment via the pins 124, thereby allowing pressure to be accurately measured. Although FIG. 1 shows an example where the electrical contacts comprise pins and wire bonds, other arrangements are also possible. For example, solder-ball contacts, and/or flip-chip packaging with ball grid arrays, among others, can be used. It is also possible to use optical coupling rather than electrical coupling illustrated in FIG. 1, for example.

The cover 106 engages the engagement surface 114 of the package substrate 102 to form a package enclosure around the pressure sensing element 104. A lip 128 can help secure the cover 106 to the substrate 102. In many embodiments, the cover 106 is made entirely of a flexible or "soft" material that forms a seal when pressed against the engagement surface 114. For example, in some embodiments the cover can be made of an elastomer. Examples of elastomers include varieties of rubber (nitrile rubber, silicone rubber, butyl rubber, flouroelastomers), polyurethane elastomers, high temperature polyolefin, silicone, and thermoplastic elastomers. The soft nature of the cover helps to form a good seal between the cover 106 and substrate 102, and also helps to limit vibration there between to help prevent damage to the assembly. In other embodiments, an integrated gasket or even a separate gasket (e.g., an O-ring) could be positioned between the cover 106 and the engagement surface 114. However, compared to simply including a soft cover, a separate gasket makes manufacture of the package assembly 100 more complicated in some regards, due to the extra processing and/or assembly steps required.

The fluid-flow channel 108 is disposed in the cover 106 and extends there through. In the example of FIGS. 1-3, the fluid flow channel 108 includes an elongate channel 130 that extends linearly from an external surface 132 of the cover 106 to an exposed surface 134 of the blocking member 110. From the elongate channel 130, conduits 136a, 136b extend laterally and downwardly along opposing vertical surfaces of the blocking member 110. Because the fluid flow channel 108 "jogs" so as to impede a direct (e.g., line of sight) path between the external environment and the pressure sensing element 104, the fluid-flow channel 108 provides some protection from external objects that could possibly damage the pressure sensing element 104.

To provide additional protection from the ambient environment, a gel or polymer film region 138 may be formed over the pressure sensing element 104. This gel or film region 138, which encapsulates the pressure sensing element 104, provides an additional protective barrier, but still transfers pressure from the ambient environment to the pressure sensing element 104. In some embodiments, this gel or film can include any of the following materials, but is not limited to these materials: perfluoropolyether/silicone (trade name SIFEL), fluoroelastomer, fluorosilicone, or parylene).

FIGS. 4-9 show depictions of additional covers in accordance with some embodiments. Notably, whatever fluid-flow channel geometry is used in these embodiments, the fluid flow channel includes a blocking member positioned to prevent the fluid-flow channel from providing an unimpeded path (e.g., a linear path) between the external environment and the pressure sensing element. These are but a few examples of geometries that could be used for the cover and fluid-flow channel, and are in no way limiting.

In many embodiments, the fluid-flow channel is sufficiently sized to allow air to flow through, such that ambient pressure can be measured. In addition, a fluid flow channel is often of sufficient size to allow water to flow there through (e.g., to drain from a packaging assembly), thereby limiting water build-up in packages. For example, due to $H_2$ bonding and water adhesion forces, apertures defining a fluid-flow channel may be at least approximately 2.5 mm in diameter, but minimum diameters for such holes can vary widely depending on the material of the cover, the thickness of the cover, the fluid to be drained, and other factors.

Figure 4:
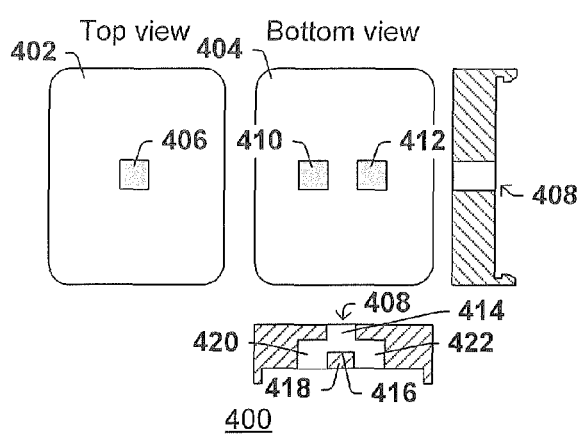
FIGS. 4-9 each show top, bottom and cross sectional views of a cover in accordance with some embodiments.

FIG. 4 illustrates a cover 400 that includes a top surface 402 and a bottom surface 404. The top surface 402 includes a central aperture 406 that defines the beginning of a fluid-flow channel 408 extending through the cover 400. The bottom surface 404 includes two bottom apertures 410, 412 which collectively define the end of the fluid flow channel 408. The fluid flow channel 408 includes an elongate channel 414 that extends linearly from the top surface 402 to an exposed surface 416 of a blocking member 418. From the elongate channel 414, conduits 420, 422 extend laterally and downwardly along opposing vertical surfaces of the blocking member 418 to the two bottom apertures 410, 412.

Figure 5:
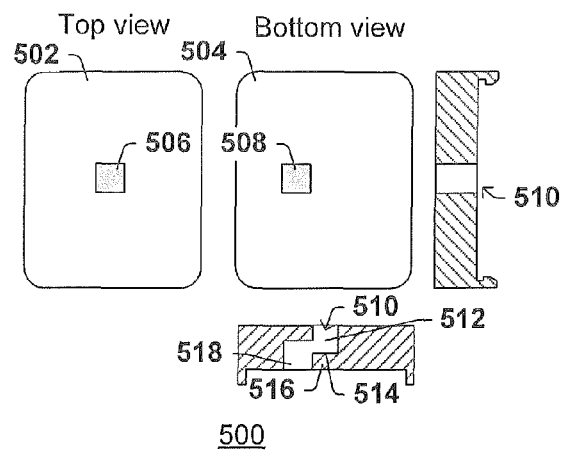

FIG. 5 illustrates another cover 500 that includes a top surface 502 and a bottom surface 504. Here, the top surface 502 again includes a central aperture 506, but the bottom surface 504 includes only one bottom aperture 508 wherein a fluid flow channel 510 is defined between the apertures 506, 508. The fluid flow channel includes elongate channel 512 extending linearly from the aperture 506 to an exposed surface 514 of a blocking member 516. From the elongate channel 512, only one conduit 518 extends laterally and downwardly along a single vertical surface of the blocking member 516 to the bottom aperture 508.

Figure 6:
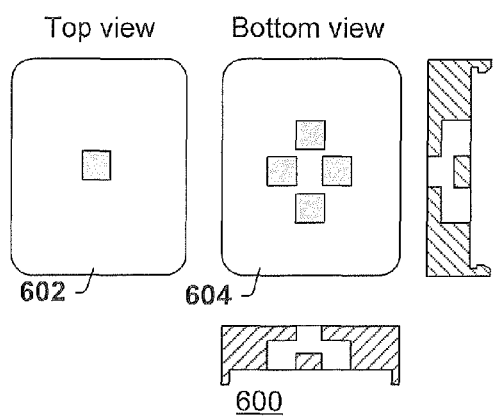

FIG. 6 illustrates another cover 600 that includes a top surface 602 and a bottom surface 604. Here, the bottom surface 604 includes four apertures which define the end of a fluid flow channel.

Figure 7:
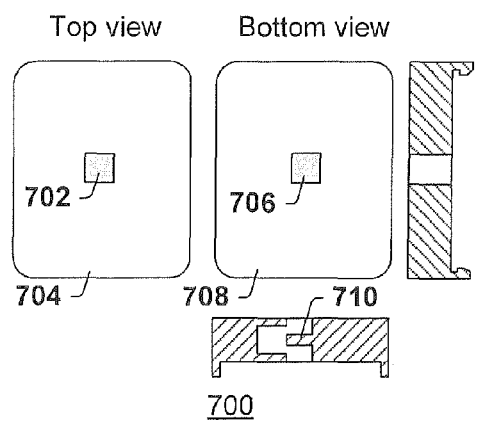

FIG. 7 illustrates another cover 700 that includes a single aperture 702 on a top cover surface 704 and a single aperture 706 on a bottom cover surface 708, wherein these apertures are aligned with respect to an axis passing perpendicularly through the cover 700. To prevent a direct linear path from passing though the cover 700, a blocking member 710 juts out from a sidewall into a fluid flow channel defined between the apertures 702, 706.

Figure 8:
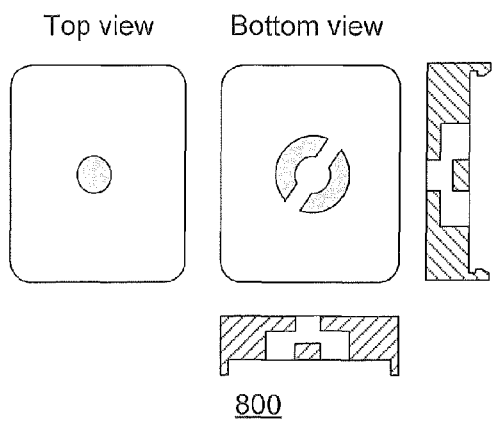

FIG. 8 illustrates another embodiment where circular apertures are used. The apertures could also have other shapes (e.g., polygonal, oval) and are not limited to any particular geometry.

Figure 9:
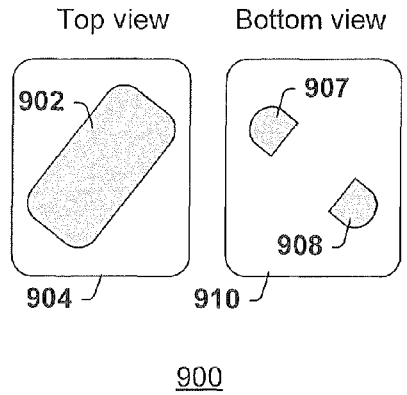

FIG. 9 illustrates another cover 900 wherein an elongate oval aperture 902 is included on a top cover surface 904 and smaller apertures 906, 908 are included on a bottom cover surface 910. As can be appreciated from FIGS. 4-9, any number of apertures can be used, and they can be arranged in any number of configurations. Further, the top and bottom surfaces of any of the illustrated embodiments could also be "flipped" (e.g., a flipped version of FIG. 4 could include two apertures on the top surface and a single aperture on the bottom surface). Thus, the top surface is not limited to only having a single aperture as is explicitly illustrated in FIGS. 4-9, but can have additional apertures as well. It will, however, be appreciated that having fewer apertures (or smaller apertures) on the top surface tends to reduce exposure of the pressure sensing element to unwanted intrusion. For example, if only one small aperture is included on the top surface, it is less likely that a stray wire will enter this small aperture compared to if a very large aperture (or many small apertures) are included on the top surface.

Figure 10A:
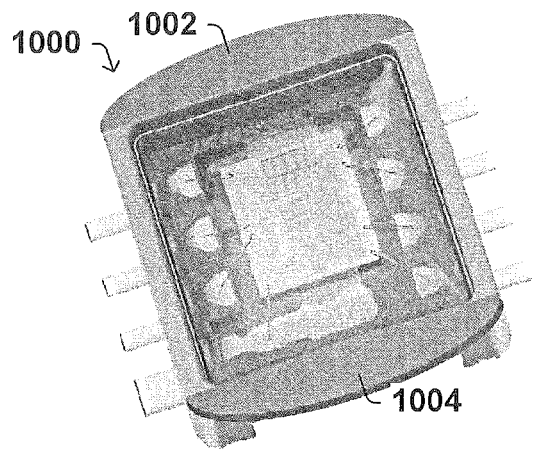
FIGS. 10A, 10B show an embodiment where a package substrate includes tabs that engage corresponding recesses in a cover that fits over the package substrate so the cover can snap-on and/or snap-off the package substrate.
Figure 10B:
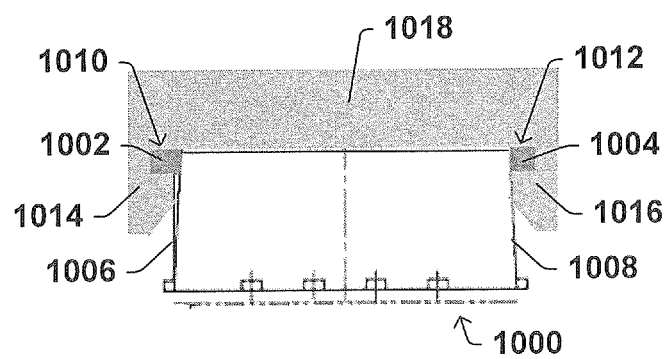

FIG. 10A illustrates another embodiment where a package substrate 1000 includes tabs 1002, 1004 that extend laterally from sidewalls 1006, 1008, respectively, of the package substrate 1000. As shown in FIG. 10B, these tabs 1002, 1004 engage corresponding recesses 1010, 1012, respectively in lips 1014, 1016, respectively of a cover 1018. The tabs 1002,

1004 and recesses 1010, 1012 are designed to allow the cover 1018 to removably snap-on and snap-off the packaging substrate 1000.

The cover and package assembly can also be molded into more complicated geometries to match the existing gasket outer dimensions used by customers in their applications. In some embodiments, the molded package may include another blocking member or a winding path. Because the cover and package assembly includes its own fluid-channel, however, the package assembly can reduce the space needed for future generations of the molded package for the customer's application (e.g., a side door airbag). Thus, the inventive cover and package assembly can eliminate or reduce the need for the fluid-channel in the molded package assembly to free up the space for other components. At the same time, the cover and package assembly can still be a drop in replacement for legacy side door airbag molded packages, due to its small size.

Figure 11:
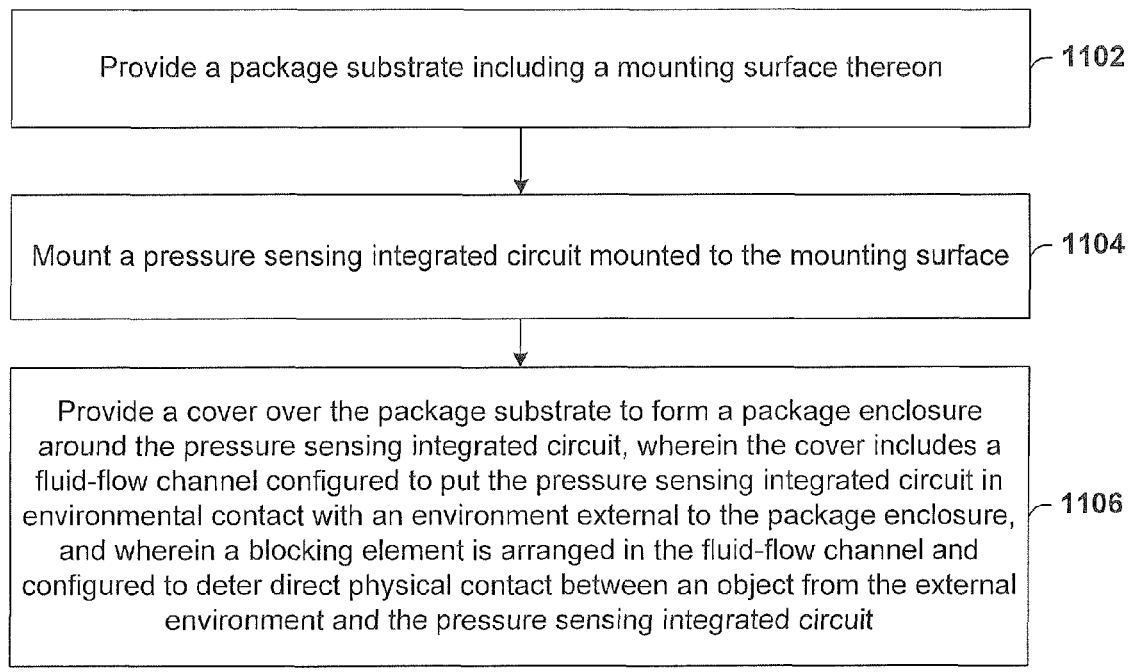
FIG. 11 shows a method in flow-chart format in accordance with some embodiments.

Turning now to FIG. 11, one can see a method of operation 1100 in accordance with some embodiments. While this method 1100 is illustrated and described below as a series of acts or events, the present disclosure is not limited by the illustrated ordering of such acts or events. The same is true for other methods disclosed herein. For example, some acts may occur in different orders and/or concurrently with other acts or events apart from those illustrated and/or described herein. In addition, not all illustrated acts are required, and one or more of the acts depicted herein may be carried out in one or more separate acts or phases.

The method 1100 starts at 1102, wherein a package substrate is provided. The package substrate includes a mounting surface thereon.

At 1104, a pressure sensing integrated circuit is mounted to the mounting surface.

At 1106, a cover is provided over the package substrate to form a package enclosure around the pressure sensing integrated circuit. The cover includes a fluid-flow channel configured to put the pressure sensing integrated circuit in environmental contact with an environment external to the package enclosure. A blocking member is arranged in the fluid-flow channel and configured to deter direct physical contact between an object from the external environment and the pressure sensing integrated circuit.

Although the disclosure has been shown and described with respect to one or more implementations, equivalent alterations and modifications will occur to others skilled in the art based upon a reading and understanding of this specification and the annexed drawings.

For example, although package assemblies above have been described in the context of having top and bottom surfaces that include one or more apertures that define entrance/exit regions of a fluid-flow channel, it will be appreciated that apertures can also be in other regions of the package assembly. For example, in some embodiments the cover is larger than the package substrate and both the entrance and exit apertures are on the bottom of the cover, such that one of the "bottom" apertures is exposed to the environment and another is adjacent to the pressure sensor. In still other embodiments the cover is thick, allowing an aperture on the side(s) and also the bottom. Hence, the surfaces of the cover and/or package substrate can be referred to generally as a first surface, a second surface, etc., wherein as the identifiers "first", "second", etc. do not imply any type of ordering or placement with respect to other elements; but rather "first" and "second" and other similar identifiers are just generic identifiers. In addition, it will be appreciated that the term "coupled" includes direct and indirect coupling. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more". Furthermore, to the extent that the terms "includes", "having", "has", "with", or variants thereof are used in either the detailed description or the claims, such terms are intended to be inclusive in a manner similar to the term "comprising."

What is claimed is:

1. An apparatus, comprising:
 a package substrate including a mounting surface thereon;
 a pressure sensing element mounted to the mounting surface;
 a cover configured to engage the package substrate to form a package enclosure around the pressure sensing element;
 a fluid-flow channel disposed in the cover and configured to put the pressure sensing element in environmental contact with an environment external to the package enclosure, thereby allowing fluid from the external environment to both enter and exit the package enclosure; and
 a blocking member, which is seamlessly part of the cover, arranged in the fluid-flow channel and configured to deter direct physical contact between an object from the external environment and the pressure sensing element.

2. The apparatus of claim 1, wherein the pressure sensing element comprises integrated circuit that includes a micro electrical mechanical system having a diaphragm.

3. The apparatus of claim 2, wherein the pressure sensing element comprises a lead frame or chip carrier to which the integrated circuit is mounted.

4. The apparatus of claim 1, wherein the fluid-flow channel begins at a first aperture on a first surface of the cover and terminates at a second aperture on a second surface of the cover, wherein the fluid-flow channel comprises a non-linear path between the first and second apertures.

5. The apparatus of claim 1, wherein the fluid flow channel comprises:
 an elongate channel extending linearly from a surface of the cover to a surface of the blocking member; and
 at least one conduit extending laterally and downwardly along at least one surface of the blocking member.

6. The apparatus of claim 5, wherein the electrical contacts comprise at least one of: a conductive pin or a conductive ball-like structure.

7. The apparatus of claim 1, wherein the fluid flow channel comprises:
 an elongate channel extending linearly from a surface of the cover to a surface of the blocking member; and
 at least two conduits extending laterally and downwardly along at least two respective surfaces of the blocking member.

8. The apparatus of claim 1, further comprising:
at least one electrical contact coupled to the pressure sensing integrated circuit and externally accessible with regards to the package enclosure, wherein the electrical contact is configured to provide electrical communication between the pressure sensing integrated circuit and a circuit external to the package enclosure.

9. The apparatus of claim 1, wherein the cover and package substrate are configured such that the cover can removably snap-on and snap-off with respect to the package substrate.

10. The apparatus of claim 1, wherein the package substrate comprises:
a peripheral sidewall extending upwardly from a peripheral base; and
a tab extending laterally from the peripheral sidewall.

11. The apparatus of claim 10, wherein the cover comprises:
a lip extending downwardly from a lower side of the cover; and
a recess disposed in the lip and configured to engage the tab to couple the cover to the package substrate.

12. The apparatus of claim 1, wherein the cover is flexible such that a seal is formed between the cover and the package substrate.

13. The apparatus of claim 12, wherein the cover comprises an elastomer material.

14. The apparatus of claim 13, wherein the elastomer material includes at least one of the following materials: rubber, nitrile rubber, silicone rubber, butyl rubber, flouroelastomer, polyurethane elastomer, high temperature polyolefin, silicone, or thermoplastic elastomer.

15. The apparatus of claim 1, further comprising:
epoxy or adhesive disposed between the package substrate and the cover to secure the package substrate to the cover.

16. The apparatus of claim 1, further comprising:
a gel region formed inside the package enclosure around the pressure sensing element.

17. A method, comprising:
providing a package substrate including a mounting surface thereon;
mounting a pressure sensing integrated circuit mounted to the mounting surface;
providing a cover over the package substrate to form a package enclosure around the pressure sensing integrated circuit, wherein the cover includes a fluid-flow channel configured to put the pressure sensing integrated circuit in environmental contact with an environment external to the package enclosure, and wherein a blocking member is seamlessly arranged in the fluid-flow channel and configured to deter direct physical contact between an object from the external environment and the pressure sensing integrated circuit.

18. The method claim 17, further comprising:
providing at least one electrical contact externally accessible with regards to the package enclosure and coupled to the pressure sensing integrated circuit; and
coupling the pressure sensing integrated circuit to a circuit external to the package enclosure via the at least one electrical contact.

19. The method of claim 18, wherein the electrical contact comprise at least one of: a conductive pin or a conductive ball-like structure.

20. The method of claim 17, wherein providing the cover over the package substrate comprises snapping the cover onto the package substrate.

21. An apparatus, comprising:
a package substrate including a mounting surface thereon;
a pressure sensing element mounted to the mounting surface;
a cover configured to engage the package substrate to form a package enclosure around the pressure sensing element;
a fluid-flow channel having an at least approximately constant unobstructed channel area extending continuously between a first aperture on a first surface of the cover and the second aperture on a second surface of the cover, the fluid-flow channel being configured to put the pressure sensing element in environmental contact with an environment external to the package enclosure to allow fluid from the external environment to enter and exit the package enclosure; and
a blocking member arranged proximate to the fluid-flow channel without obstructing the channel area, the blocking member configured to deter direct physical contact between an object from the external environment and the pressure sensing element.

* * * * *